(12) United States Patent
Song

(10) Patent No.: US 9,755,401 B2
(45) Date of Patent: Sep. 5, 2017

(54) LASER, LASER MODULATION METHOD AND LASER COMBINATION SYSTEM

(71) Applicant: Huawei Technologies Co., Ltd., Shenzhen (CN)

(72) Inventor: Xiaolu Song, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/043,757

(22) Filed: Feb. 15, 2016

(65) Prior Publication Data

US 2016/0172824 A1    Jun. 16, 2016

Related U.S. Application Data

(63) Continuation of application No. PCT/CN2013/081543, filed on Aug. 15, 2013.

(51) Int. Cl.
*H01S 5/10* (2006.01)
*H01S 5/14* (2006.01)
*H01S 5/40* (2006.01)
H01S 5/00 (2006.01)
H01S 5/022 (2006.01)
H01S 5/062 (2006.01)

(52) U.S. Cl.
CPC ............ *H01S 5/1042* (2013.01); *H01S 5/142* (2013.01); *H01S 5/4025* (2013.01); *H01S 5/0078* (2013.01); *H01S 5/02248* (2013.01); *H01S 5/06226* (2013.01)

(58) Field of Classification Search
CPC ...... H01S 5/1042; H01S 5/4025; H01S 5/142; H01S 5/02248; H01S 5/0078
See application file for complete search history.

(56) References Cited

U.S. PATENT DOCUMENTS

| 7,406,267 B2 | 7/2008 | Mahgerefteh et al. |
| 7,505,694 B2 | 3/2009 | Johnson et al. |
| 7,542,683 B2 | 6/2009 | Matsui et al. |
| 7,809,280 B2 | 10/2010 | Mahgerefteh et al. |

(Continued)

FOREIGN PATENT DOCUMENTS

| CN | 1862898 A | 11/2006 |
| CN | 101465515 A | 6/2009 |

(Continued)

OTHER PUBLICATIONS

An et al., "Modulation Speed Enhancement of Directly Modulated Lasers Using a Micro-Ring Resonator," 2012 Optical Interconnects COnference, May 20-23, 2012, 2 pages, Santa Fe, NM.

(Continued)

*Primary Examiner* — Dung Nguyen
(74) *Attorney, Agent, or Firm* — Slater Matsil, LLP

(57) ABSTRACT

In the field of optical networks, a laser, a laser modulation method and a laser combination system are disclosed. The laser includes a gain medium, a resonant cavity, and a second microring resonator. The resonant cavity includes a first cavity mirror and a second cavity mirror. The first cavity mirror is located at one port of the gain medium, the second cavity mirror is located at another port of the gain medium, and the second cavity mirror includes a splitter, a first microring resonator, and a reflecting grating.

16 Claims, 4 Drawing Sheets

(56) References Cited

U.S. PATENT DOCUMENTS

| | | | |
|---|---|---|---|
| 2006/0222038 A1 | 10/2006 | Yamazaki | |
| 2006/0280505 A1* | 12/2006 | Varshneya | H04B 10/1123 398/140 |
| 2008/0166134 A1 | 7/2008 | McCallion et al. | |
| 2009/0290880 A1* | 11/2009 | Huang | H04B 10/25137 398/115 |
| 2015/0222089 A1 | 8/2015 | Jeong | |

FOREIGN PATENT DOCUMENTS

| | | |
|---|---|---|
| CN | 103098489 | 5/2013 |
| EP | 1786121 A1 | 5/2007 |
| JP | 2010027664 A | 2/2010 |
| JP | 2011253930 A | 12/2011 |
| WO | 2008080171 A1 | 7/2008 |
| WO | 2009133631 A1 | 11/2009 |
| WO | 2013114577 A1 | 8/2013 |

OTHER PUBLICATIONS

Matsui et al., "Chirp-Managed Directly Modulated Laser (CML)," IEEE Photonics Technology Letters, Jan. 15, 2006, 3 pages, vol. 18, No. 2.

* cited by examiner

LASER, LASER MODULATION METHOD AND LASER COMBINATION SYSTEM

This application is a continuation of International Application No. PCT/CN2013/081543, filed on Aug. 15, 2013, which is hereby incorporated by reference in its entirety.

TECHNICAL FIELD

The present invention relates to the field of optical networks, and in particular, to a laser, a laser modulation method and a laser combination system.

BACKGROUND

Rapid growth of network traffic promotes constant growth of line card capacities of routers and transport equipment. With the development of the optical communications industry, technologies related to optical transceiver components are also evolving. High-rate, low-cost, low-power consumption, and miniaturized optical components gradually become a hotspot to which the industry pays attention.

Currently, in most client-side optical modules, a directly modulated laser (DML) or an electro-absorption modulated laser (EML) is used as a transmit-side device. The directly modulated laser has advantages of low costs, miniaturization, and the like, and is widely used in the field of short-distance interconnections.

Optical modulation is superimposing a signal that carries information on a carrier lightwave. Modulation enables a parameter of a carrier lightwave to change with a change of a signal superimposed on the carrier lightwave. These parameters include an amplitude, a phase, a frequency, polarization, a wavelength, and the like of the lightwave. A modulated lightwave that carries information is transmitted in a fiber, and demodulated by an optical receiving system to detect required information. Optical output of an existing directly modulated laser (mainly a lightwave amplitude is modulated) may change with a parameter of the laser. The most commonly used modulation of laser output is performing amplitude modulation by controlling a current that flows through a device, or obtaining an amplitude modulation output by changing a parameter of a resonant cavity.

However, an optical eye diagram output by an existing directly modulated laser during high-speed modulation is nearly closed. After fiber transmission, it is difficult to perform decision and recovery at a receiving part. If an external filter is used, a size of the device is relatively large and integration is difficult to perform.

SUMMARY

Embodiments provide a laser, a laser modulation method and a laser combination system, which improve device integration and can acquire an optical eye diagram with a good effect.

To achieve the foregoing objective, the following technical solutions are used in the embodiments.

According to a first aspect, a laser is provided. The laser includes a gain medium, a resonant cavity, and a second microring resonator. The resonant cavity includes a first cavity mirror and a second cavity mirror, the first cavity mirror is located at one port of the gain medium, and the second cavity mirror is located at another port of the gain medium. The second cavity mirror includes one splitter, one first microring resonator, and one reflecting grating. An input port of the splitter is connected to the another port of the gain medium. A first output port of the splitter is connected to an input port of the first microring resonator, a second output port of the splitter is connected to the second microring resonator, and a download port of the first microring resonator is connected to the reflecting grating. The gain medium is configured to generate a laser gain signal. The resonant cavity that is formed by the first cavity mirror and the second cavity mirror performs resonance on the laser gain signal, and a laser is generated after a laser generation condition is met, where the first microring resonator is configured to perform mode selection on the laser gain signal according to a filtering response curve of the first microring resonator, and the reflecting grating is configured to reflect the laser gain signal obtained after the mode selection. The gain medium is further configured to load a modulation signal to the laser that is generated in the resonant cavity, to generate a modulated laser. The splitter is configured to: after the modulated laser is generated in the resonant cavity, output the generated modulated laser to the second microring resonator through the second output port. An input port of the second microring resonator is connected to the second output port of the splitter, the second microring resonator is configured to filter the modulated laser according to a filtering response curve of the second microring resonator to generate an output laser, and output the output laser through a download port of the second microring resonator, where the output laser matches the filtering response curve of the second microring resonator.

With reference to the first aspect, in a first possible implementation manner of the first aspect, the laser further includes a detector that is connected to the second microring resonator. An input port of the detector is connected to a straight-through port of the second microring resonator, to detect a signal that is output by the straight-through port of the second microring resonator.

With reference to the first aspect or the first possible implementation manner, in a second possible implementation manner of the first aspect, the splitter is specifically configured to: acquire, through the input port of the splitter, the laser gain signal to which the modulation signal is loaded and/or the modulated laser; split the laser gain signal into an add laser gain signal and a drop laser gain signal, output the add laser gain signal to the first microring resonator, and output the drop laser gain signal to the second microring resonator; and/or split the modulated laser into an add modulated laser and a drop modulated laser, output the add modulated laser to the first microring resonator, and output the drop modulated laser to the second microring resonator.

With reference to the first aspect or any one of the first and the second possible implementation manners, in a third possible implementation manner of the first aspect: a parameter of the first microring resonator is the same as a parameter of the second microring resonator, and the parameter includes: a radius of a microring waveguide, a spacing between a straight waveguide and a microring waveguide, a relative spacing between two straight waveguides, and a position relationship between two straight waveguides.

With reference to the first aspect or any one of the possible implementation manners in the first aspect, in a fourth possible implementation manner of the first aspect: a center wavelength of the modulated laser is within a rising-edge range of the filtering response curve of the first microring resonator, and the center wavelength of the modulated laser is within a rising-edge range of the filtering response curve of the second microring resonator.

With reference to the first aspect or any one of the possible implementation manners in the first aspect, in a fifth possible implementation manner of the first aspect: a relative distance between a resonant peak of the filtering response curve of the first microring resonator and a resonant peak of the filtering response curve of the second microring resonator is within a preset threshold range.

With reference to the first aspect or any one of the possible implementation manners in the first aspect, in a sixth possible implementation manner of the first aspect: a variation of a temperature difference between the first microring resonator and the second microring resonator is less than a preset threshold, so that the relative distance between the resonant peak of the filtering response curve of the first microring resonator and the resonant peak of the filtering response curve of the second microring resonator is constant.

According to a second aspect, a laser modulation method is provided. The method includes generating a laser gain signal; performing mode selection on the laser gain signal according to a first filtering response curve; and performing resonance on the laser gain signal obtained after the mode selection, so as to generate a laser after a laser generation condition is met. The method also includes loading a modulation signal to the laser, to generate a modulated laser; and filtering the modulated laser according to a second filtering response curve, to generate an output laser, where the output laser matches the second filtering response curve.

With reference to the second aspect, in a first possible implementation manner of the second aspect, the method further includes detecting a laser of the modulated laser except the output laser.

According to a third aspect, a laser combination system is provided, including: at least two lasers described above, where output ports of the at least two lasers are connected to an input port of a common waveguide.

In the laser, the laser modulation method and the laser combination system provided in the embodiments, according to a chirp effect of a directly modulated laser, functions of mode selection and filtering are implemented by using two microring structures with the same structure and similar parameter settings. The microring structure is favorable for integration, therefore, integration of the directly modulated laser can be improved while an optical eye diagram with a good effect is acquired.

BRIEF DESCRIPTION OF THE DRAWINGS

To describe the technical solutions in the embodiments or in the prior art more clearly, the following briefly introduces the accompanying drawings required for describing the embodiments or the prior art. Apparently, the accompanying drawings in the following description show merely some embodiments.

DETAILED DESCRIPTION OF ILLUSTRATIVE EMBODIMENTS

The following clearly describes the technical solutions in the embodiments with reference to the accompanying drawings in the embodiments. Apparently, the described embodiments are merely some but not all of the embodiments.

Figure 1:
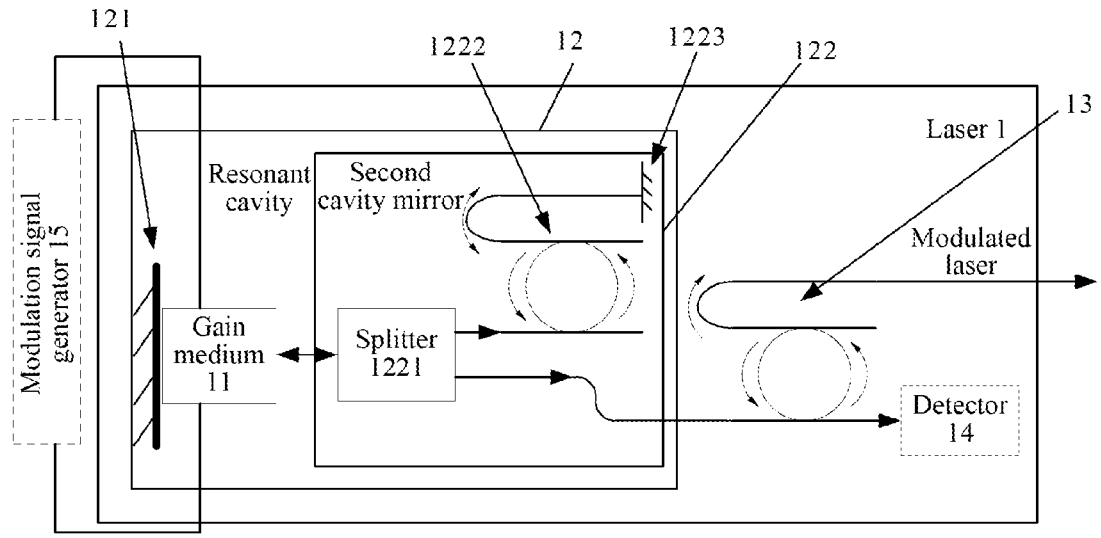
FIG. 1 is a schematic structural diagram of a laser according to an embodiment.

An embodiment provides a laser 1, applied to a transmit-side device in an optical network. As shown in FIG. 1, specifically, the laser 1 includes: a gain medium 11, a resonant cavity 12, and a second microring resonator 13.

The resonant cavity 12 includes a first cavity mirror 121 and a second cavity mirror 122. The first cavity mirror 121 is located at one port of the gain medium 11. The second cavity mirror 122 is located at another port of the gain medium 11.

The second cavity mirror 122 includes a splitter 1221, a first microring resonator 1222, and a reflecting grating 1223.

An input port of the splitter 1221 is connected to the another port of the gain medium 11.

A first output port of the splitter 1221 is connected to an input port of the first microring resonator 1222, a second output port of the splitter 1221 is connected to the second microring resonator 13, and a download port of the first microring resonator 1222 is connected to the reflecting grating 1223.

The gain medium 11 is configured to generate a laser gain signal, which is an optical carrier.

The resonant cavity 12 that is formed by the first cavity mirror 121 and the second cavity mirror 122 performs resonance on the laser gain signal, and a laser is generated after a laser generation condition is met. The first microring resonator 1222 is configured to perform mode selection on the laser gain signal according to a filtering response curve of the first microring resonator 1222. The reflecting grating 1223 is configured to reflect the laser gain signal after the mode selection is performed.

The gain medium 11 is further configured to load a modulation signal to the laser that is generated in the resonant cavity 12, which is to generate a modulated laser. Specifically, during actual application, a current may be loaded to the gain medium 11 by using a modulation signal generator 15, so as to load a modulation signal that includes a pseudorandom binary sequence (PRBS) to the gain medium 11. Furthermore, the modulation signal is loaded to the laser that is generated in the resonant cavity 12. The gain medium 11 and the first cavity mirror 121 may be implemented by a reflective semiconductor optical amplifier (RSOA).

The splitter 1221 is configured to output the generated modulated laser to the second microring resonator 13 through the second output port after the modulated laser is generated in the resonant cavity 12.

Specifically, the splitter 1221 is configured to acquire, through the input port of the splitter 1221, the laser gain signal to which the modulation signal is loaded and/or the modulated laser. The splitter 1221 is configured to split the laser gain signal to which the modulation signal is loaded into an add laser gain signal and a drop laser gain signal, output the add laser gain signal to the first microring resonator 1222 and output the drop laser gain signal to the second microring resonator 13. The splitter 1221 is configured to split the modulated laser into an add modulated laser and a drop modulated laser, output the add modulated laser to the first microring resonator 1222 and output the drop modulated laser to the second microring resonator 13. An add power of the splitter is greater than a drop power of the splitter, in other words, a power of the add laser gain signal is greater than a power of the drop laser gain signal, and a power of the add modulated laser is greater than a power of the drop modulated laser. Specifically, a ratio of the add power to the drop power may be 4:1, or may be another ratio that meets the foregoing splitting condition.

Before the laser is generated, in the resonant cavity 12, resonance is performed only on the laser gain signal. In this case, the splitter 1221 splits only the laser gain signal. After the laser is generated, there are both the generated modulated laser and the resonating laser gain signal in the resonant cavity. In this case, the splitter 1221 splits both the modulated laser and the resonating laser gain signal.

Certainly, the modulated laser is generated in a very short time after resonance is performed on the laser gain signal, and this embodiment mainly aims to observe an optical eye diagram of the modulated laser; therefore, it may be considered that the drop laser gain signal that is generated by the splitter 1221 in this embodiment is not processed.

An input port of the second microring resonator 13 is connected to the second output port of the splitter 1221. The second microring resonator 13 is configured to filter the modulated laser according to a filtering response curve of the second microring resonator 13 to generate an output laser which matches the filtering response curve of the second microring resonator 13 and output the output laser through a download port of the second microring resonator 13.

A parameter of the first microring resonator 1222 is the same as a parameter of the second microring resonator 13. The parameters include: a radius of a microring waveguide, a spacing between a straight waveguide and a microring waveguide, a relative spacing between two straight waveguides and a position relationship between two straight waveguides. This means a structure of the first microring resonator 1222 is completely the same as a structure of the second microring resonator 13.

In this way, a center wavelength of the laser is within a rising-edge range of the filtering response curve of the first microring resonator 1222. The center wavelength of the modulated laser may be kept within a rising-edge range of the filtering response curve of the second microring resonator by adjusting a working temperature of the second microring resonator 13. This means a rising edge of filtering of the second microring resonator 13 aligns with the center wavelength of the modulated laser. A relative distance between a resonant peak of the filtering response curve of the first microring resonator 1222 and a resonant peak of the filtering response curve of the second microring resonator 13 is within a preset threshold range.

Optionally, to enable the rising edge of filtering of the second microring resonator 13 to align with the center wavelength of the modulated laser, the working temperature of the second microring resonator 13 needs to be adjusted. In this case, a temperature difference between the first microring resonator 1222 and the second microring resonator 13 has a fixed value. During use, a variation of the temperature difference between the first microring resonator 1222 and the second microring resonator 13 is kept less than a preset threshold, so that the relative distance between the resonant peak of the filtering response curve of the first microring resonator 1222 and the resonant peak of the filtering response curve of the second microring resonator 13 is constant.

Optionally, the second microring resonator 13 is further configured to output a laser through a straight-through port of the modulated laser except the output laser.

The laser 1 further includes a detector 14 that is connected to the second microring resonator 13. An input port of the detector 14 is connected to the straight-through port of the second microring resonator 13, which is intended to detect a signal that is output by the straight-through port of the second microring resonator 13, and to acquire, by detecting the laser that is output by the straight-through port of the second microring resonator 13, a related parameter of the modulated laser that is output by the download port of the second microring resonator 13. The signal that is output by the straight-through port of the second microring resonator 13 may include the drop laser gain signal that is output by the splitter 1221 before the modulated laser is generated, a laser that is filtered out by the second microring resonator 13 after the modulated laser is generated, and, during actual application, a laser that is leaked to the straight-through port of the second microring resonator 13 and matches the filtering response curve.

Broadly, that a frequency changes with time is referred to as "chirp". For the foregoing laser, because of spectrum broadening caused by a chirp effect (transient chirp and adiabatic chirp), frequency filtering is easy to implement. By filtering out a spectrum that corresponds to a low level of a signal, an extinction ratio can be improved and an optical eye diagram with a relatively good effect (such as a good eye height and good opening) can be represented in measurement.

In the laser provided in this embodiment, with a chirp effect of a directly modulated laser, functions of mode selection and filtering are implemented by using two same microring structures, which improves device integration and acquires an optical eye diagram with a good effect.

Figure 2:
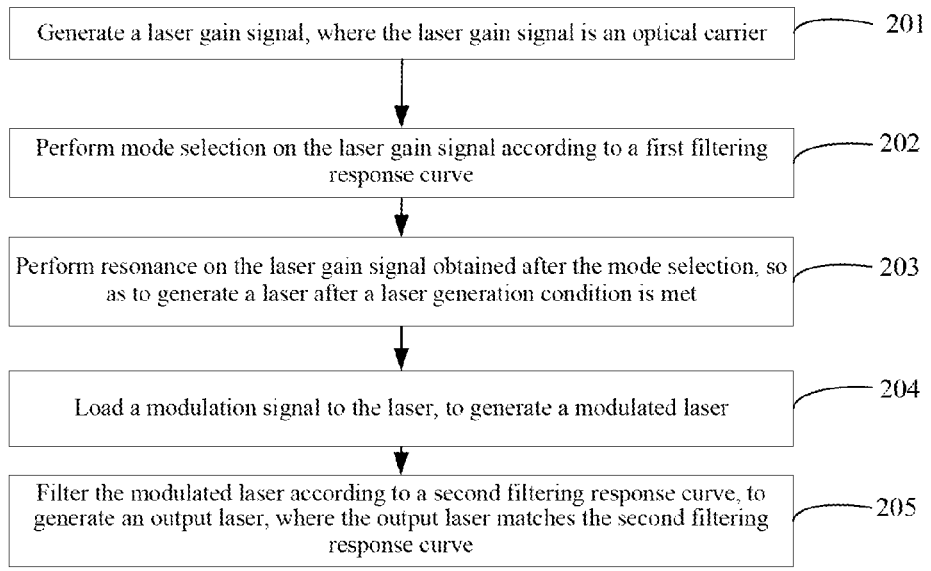
FIG. 2 is a schematic flowchart of a laser modulation method according to an embodiment.

An embodiment further provides a laser modulation method. As shown in FIG. 2, the method includes the following steps.

201: Generate a laser gain signal, where the laser gain signal is an optical carrier.

202: Perform mode selection on the laser gain signal according to a first filtering response curve.

203: Perform resonance on the laser gain signal obtained after the mode selection, so as to generate a laser after a laser generation condition is met.

204: Load a modulation signal to the laser, to generate a modulated laser.

205: Filter the modulated laser according to a second filtering response curve, to generate an output laser, where the output laser matches the second filtering response curve.

Optionally, step 205 may further include: filtering the modulated laser according to a filtering response curve, outputting a laser through another port of the modulated laser except the output laser, and detecting the laser of the modulated laser except the output laser.

In the laser modulation method provided in this embodiment, with a chirp effect of a laser, mode selection and filtering are implemented for a modulated laser signal by using two same microring structures, which improves device integration and acquires an optical eye diagram with a good effect.

Figure 3:
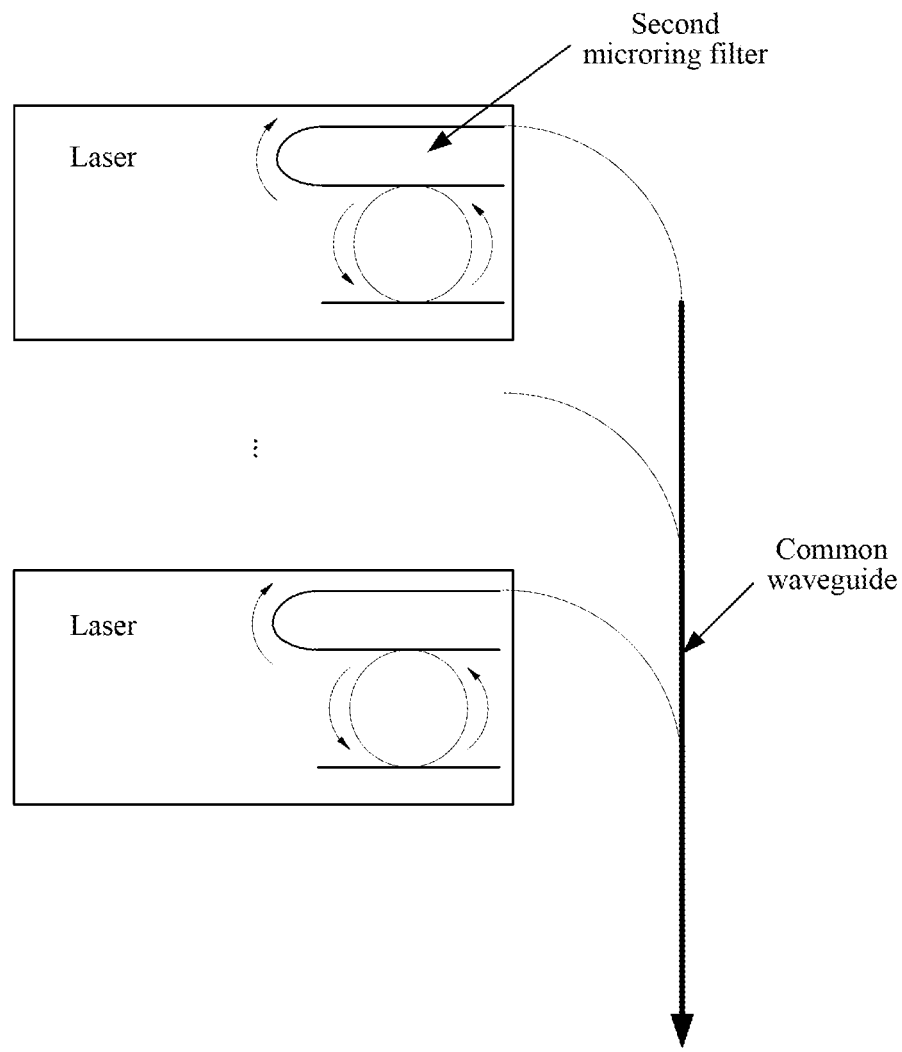
FIG. 3 is a schematic structural diagram of a laser combination system according to an embodiment.

An embodiment further provides a laser combination system. As shown in FIG. 3, the laser combination system includes at least two lasers provided in the foregoing apparatus embodiment.

Output ports of the at least two lasers (such as, a download port of a second microring resonator) are connected to an input port of a common waveguide. Output ports of modulated lasers are on microring resonators with a same structure; therefore, the at least two lasers can directly implement laser combination and output without additionally introducing an optical wavelength division multiplexing component.

In the laser combination system provided in this embodiment, laser combination and output of modulated lasers are implemented by using a common waveguide, which improves device integration.

Figure 4:
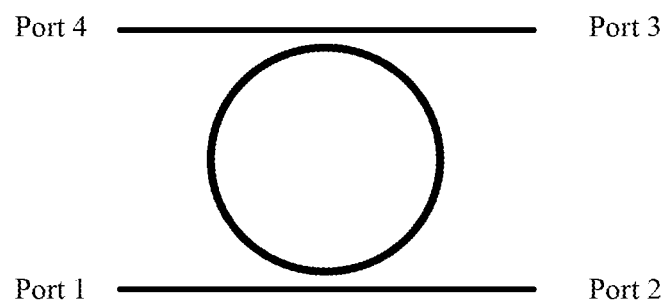
FIG. 4 is a schematic structural diagram of a microring resonator according to an embodiment.
Figure 5:
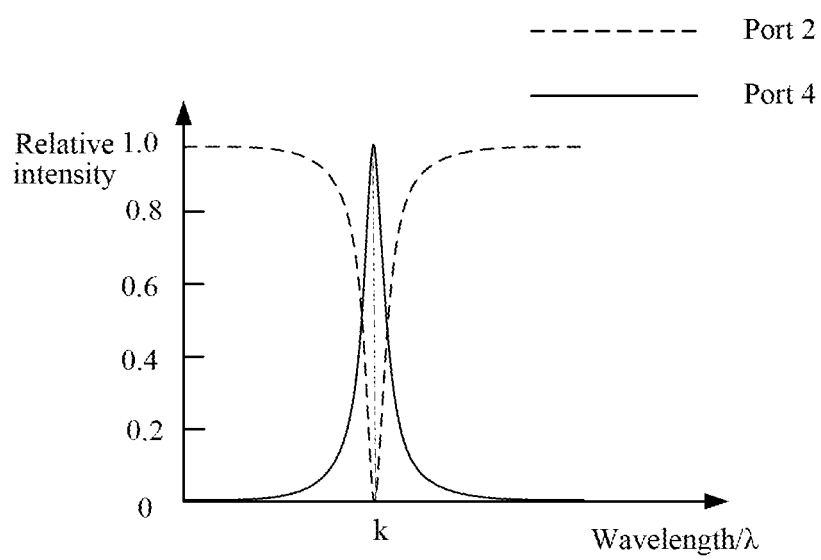
FIG. 5 is a schematic diagram of a waveform output by a microring resonator according to an embodiment.

Specifically, description is made by using an example in which a modulated laser whose wavelength $\lambda$ is k is generated. As shown in FIG. 1, a gain medium 11 and a first cavity mirror 121 are implemented by a reflective semiconductor optical amplifier. A detector 15 is implemented by a monitor photodiode detector (MPD). As shown in FIG. 4, a first microring resonator 1222 and a second microring resonator 13 each include a ring waveguide and two parallel straight waveguides. A port 1 is an input port of the microring resonator. A port 2 is a straight-through port of the microring resonator. A port 4 is a download port of the microring resonator. In this embodiment, in each of the first microring resonator 1222 and the second microring resonator 13, parameters such as a microring radius, a spacing between the ring waveguide and each of the straight waveguides are set, so that when an optical signal is input from the port 1, relationships between wave intensities and wavelengths of each output of ports are shown in FIG. 5. A vertical coordinate indicates a relative intensity of output, and a horizontal coordinate indicates a wavelength. Theoretically, a wave whose wavelength $\lambda$ is k in the optical signal that is input from the port 1 has a relative intensity of 1 at the port 4, and has a relative intensity of 0 at the port 2. That is, the wave whose wavelength $\lambda$ is k is output from the port 4. A wave whose wavelength $\lambda$ is not k in the optical signal that is input from the port 1 has a relative intensity of 0 at the port 4, and has a relative intensity of 1 at the port 2. That is, the wave whose wavelength $\lambda$ is not k is output from the port 2. During actual application, due to factors such as a device parameter, complete filtering cannot be achieved. In other words, a small part of the wave whose wavelength $\lambda$ is k is output from the port 2, and a small part of the wave whose wavelength $\lambda$ is not k is output from the port 4. However, both the parts have relatively small relative intensities, and therefore can be ignored.

In addition, parameters of each of the first microring resonator 1222 and the second microring resonator 13 such as the radius of the microring waveguide, the spacing between each of the straight waveguides and the microring waveguide, the relative spacing between the two straight waveguides, a position relationship between the two straight waveguides, and the like are completely the same. In this way, a shape of a filtering response curve of the first microring resonator 1222 is completely the same as a shape of a filtering response curve of the second microring resonator 13. In this case, a working temperature of the second microring resonator 13 is adjusted, so that the filtering response curve of the second microring resonator 13 can be translated in a frequency domain, which cause a result that a relative distance between a resonant peak of the filtering response curve of the first microring resonator 1222 and a resonant peak of the filtering response curve of the second microring resonator 13 is within a preset threshold range. That is, there is a preset relative distance between the resonant peak of the filtering response curve of the first microring resonator 1222 and the resonant peak of the filtering response curve of the second microring resonator 13. In this case, a center wavelength of the modulated laser is affected by the filtering response curve of the first microring resonator 1222, and is within a rising edge of the filtering response curve of the first microring resonator 1222, and is within a rising-edge range of the filtering response curve of the second microring resonator 13.

The reflective semiconductor optical amplifier generates a laser gain signal. The laser gain signal is an optical carrier. A splitter 1221 splits the laser gain signal into an add laser gain signal and a drop laser gain signal according to a preset ratio, outputs the add laser gain signal to the first microring resonator 1222, and outputs the drop laser gain signal to the second microring resonator 13. In this case, the drop laser gain signal is spontaneous emission light which cannot meet a laser generation condition and has no impact on generation of the modulated laser.

The first microring resonator 1222 performs mode selection on the add laser gain signal according to the filtering response curve of the first microring resonator 1222. A lightwave whose wavelength $\lambda$ is k of the add laser gain signal is output from the download port of the first microring resonator 1222, and a lightwave whose wavelength $\lambda$ is not k of the add laser gain signal is output from the straight-through port of the first microring resonator 1222. The lightwave whose wavelength $\lambda$ is k is reflected by a reflecting grating 1223 and returns to the reflective semiconductor optical amplifier through the first microring resonator 1222 and the splitter 1221. Then the lightwave whose wavelength $\lambda$ is k is reflected by a total reflector (that is, the first cavity mirror 121) of the reflective semiconductor optical amplifier, so that oscillation occurs in a resonant cavity 12. That is, the resonant cavity formed by the first cavity mirror 121 and a second cavity mirror 122 performs resonance on a laser gain signal whose wavelength $\lambda$ is k to which a modulation signal is loaded.

When the laser gain signal whose wavelength $\lambda$ is k meets the laser generation condition, a laser is formed. Meanwhile, a modulation signal generator 15 loads a modulation signal including a pseudo-random binary sequence to the laser by loading a current to the reflective semiconductor optical amplifier, to generate the modulated laser.

Figure 6:
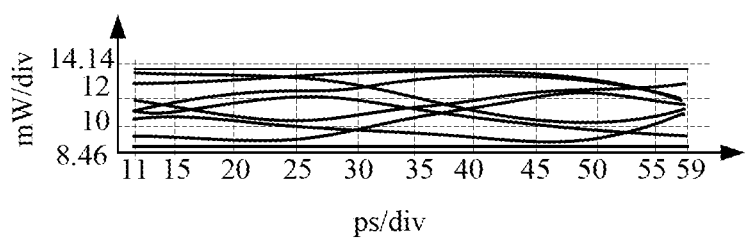
FIG. 6 is an optical eye diagram of a laser according to an embodiment.

The splitter 1221 splits the modulated laser into an add modulated laser and a drop modulated laser according to a preset ratio, and outputs the drop modulated laser to the input port of the second microring resonator 13. In this case, as shown in FIG. 6, an optical eye diagram of the drop modulated laser is nearly closed. In FIG. 6, a vertical axis indicates a power (mW/div, milliwatt per division), and a horizontal axis indicates a time (ps/div, picosecond per division). In this case, a waveform between 11 ps and 59 ps is taken as the optical eye diagram, where a lightwave power is from 8.64 mW to 14.14 mW. The second microring resonator 13 and the first microring resonator 1222 have the same structure and similar parameter settings (temperatures are different), and there is the preset relative distance between the resonant peak of the filtering response curve of the first microring resonator 1222 and the resonant peak of the filtering response curve of the second microring resonator 13; therefore, the second microring resonator 13 filters the modulated laser according to the filtering response curve of the second microring resonator 13 to generate an output laser, and outputs the output laser through the download port of the second microring resonator 13. The output laser matches the filtering response curve of the second microring resonator 13.

Figure 7:
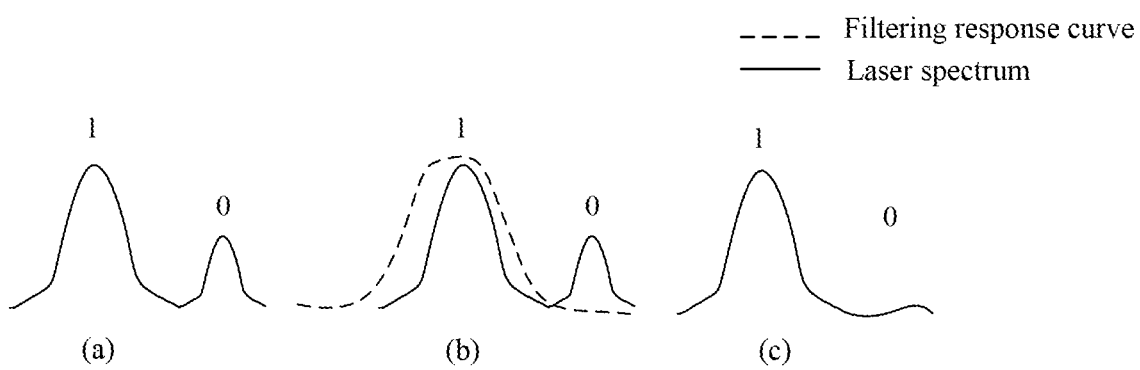
FIG. 7 is a schematic diagram of a filtering principle of a laser according to an embodiment.

As shown in FIG. 7, spectrum broadening caused by a chirp effect (transient chirp and adiabatic chirp) of a directly modulated laser makes it easy to implement spectrum filtering. As shown in FIG. 7(a), a spectrum that is output under an adiabatic chirp effect presents a bimodal pattern (corresponding to levels "0" and "1"). As shown in FIG. 7(b), a part of spectrum that corresponds to the level "0" is filtered out according to a filtering response curve by using a filter. As shown in FIG. 7(c), an output laser that matches the filtering response curve is obtained. Therefore, an extinction ratio can be improved, and a representation of the output laser in measurement is an optical eye diagram with a relatively good effect (such as a good eye height).

Figure 8:
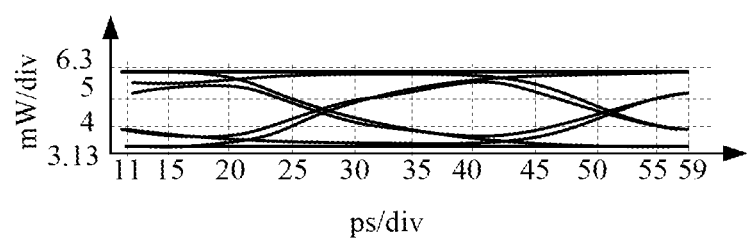
FIG. 8 is another optical eye diagram of a laser according to an embodiment.

In this case, an optical eye diagram which has a relatively good effect of the modulated laser that is output by the download port of the second microring resonator 13 is shown in FIG. 8. In FIG. 8, a vertical axis indicates a power (mW/div, milliwatt per division), and a horizontal axis indicates a time (ps/div, picosecond per division). In this case, a waveform between 11 ps and 59 ps is taken as the optical eye diagram, where a lightwave power is from 3.13 mW to 6.3 mW.

An optical filter in the laser that is provided in this embodiment is an adiabatic chirp design for the directly modulated laser. The optical filter has an absorption function for spectrum energy. There is a matching relationship between an absorption curve and a working characteristic of the directly modulated laser, so that spectra of "1" and "0" after modulation fall at proper positions in an absorption curve envelope of the optical filter. For example, "1" is near a peak of the curve, and "0" is within a valley area of the curve envelope. In this way, energy of the spectrum of "0" is absorbed, and energy of "1" passes.

Optionally, when filtering the modulated laser, the second microring resonator 13 outputs a laser through the straight-through port of the second microring resonator 13 of the modulated laser except the output laser.

The straight-through port of the second microring resonator 13 is connected to a monitor photodiode detector, which can detect the laser output by the straight-through port of the second microring resonator 13 of the modulated laser except the output laser, so as to measure a corresponding parameter of the modulated laser that is output by the download port of the second microring resonator 13.

In the laser and the laser modulation method provided in the embodiments, with a chirp effect of a laser, mode selection and filtering are implemented for a modulated laser signal by using two microring structures with the same structure and similar parameter settings, which improves device integration and acquires an optical eye diagram with a good effect.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device, comprising a gain medium, a resonant cavity, and a second microring resonator, wherein:
   the resonant cavity comprises a first cavity mirror and a second cavity mirror, the first cavity mirror is located at one port of the gain medium, and the second cavity mirror is located at another port of the gain medium;
   the second cavity mirror comprises one splitter, one first microring resonator, and one reflecting grating;
   an input port of the splitter is connected to the another port of the gain medium;
   a first output port of the splitter is connected to an input port of the first microring resonator, a second output port of the splitter is connected to the second microring resonator, and a download port of the first microring resonator is connected to the reflecting grating;
   the gain medium is configured to generate a laser gain signal;
   the resonant cavity that is formed by the first cavity mirror and the second cavity mirror performs resonance on the laser gain signal, and a laser is generated after a laser generation condition is met, wherein the first microring resonator is configured to perform mode selection on the laser gain signal according to a filtering response curve of the first microring resonator, and the reflecting grating is configured to reflect the laser gain signal obtained after the mode selection;
   the gain medium is further configured to load a modulation signal to the laser that is generated in the resonant cavity, to modulate the laser that is generated in the resonant cavity and generate a modulated laser;
   the splitter is configured to output the generated modulated laser to the second microring resonator through the second output port after the modulated laser is generated in the resonant cavity; and
   an input port of the second microring resonator is connected to the second output port of the splitter, the second microring resonator is configured to filter the modulated laser according to a filtering response curve of the second microring resonator to generate an output laser, and output the output laser through a download port of the second microring resonator, wherein the output laser matches the filtering response curve of the second microring resonator.

2. The device according to claim 1, further comprising:
   a detector that is connected to the second microring resonator, an input port of the detector being connected to a straight-through port of the second microring resonator, and the detector being configured to detect a signal that is output by the straight-through port of the second microring resonator.

3. The device according to claim 1, wherein the splitter is further configured to:
   acquire, through the input port of the splitter, the laser gain signal to which the modulation signal is loaded and the modulated laser;
   split the laser gain signal into an add laser gain signal and a drop laser gain signal, output the add laser gain signal to the first microring resonator, and output the drop laser gain signal to the second microring resonator; and
   split the modulated laser into an add modulated laser and a drop modulated laser, output the add modulated laser to the first microring resonator, and output the drop modulated laser to the second microring resonator.

4. The device according to claim 1, wherein the splitter is further configured to:

acquire, through the input port of the splitter, the laser gain signal to which the modulation signal is loaded and the modulated laser;

split the laser gain signal into an add laser gain signal and a drop laser gain signal, output the add laser gain signal to the first microring resonator, and output the drop laser gain signal to the second microring resonator; or split the modulated laser into an add modulated laser and a drop modulated laser, output the add modulated laser to the first microring resonator, and output the drop modulated laser to the second microring resonator.

5. The device according to claim 1, wherein the splitter is further configured to:

acquire, through the input port of the splitter, the laser gain signal to which the modulation signal is loaded;

split the laser gain signal into an add laser gain signal and a drop laser gain signal, output the add laser gain signal to the first microring resonator, and output the drop laser gain signal to the second microring resonator; and split the modulated laser into an add modulated laser and a drop modulated laser, output the add modulated laser to the first microring resonator, and output the drop modulated laser to the second microring resonator.

6. The device according to claim 1, wherein the splitter is further configured to:

acquire, through the input port of the splitter, the laser gain signal to which the modulation signal is loaded;

split the laser gain signal into an add laser gain signal and a drop laser gain signal, output the add laser gain signal to the first microring resonator, and output the drop laser gain signal to the second microring resonator; or split the modulated laser into an add modulated laser and a drop modulated laser, output the add modulated laser to the first microring resonator, and output the drop modulated laser to the second microring resonator.

7. The device according to claim 1, wherein the splitter is further configured to:

acquire, through the input port of the splitter, the modulated laser;

split the laser gain signal into an add laser gain signal and a drop laser gain signal, output the add laser gain signal to the first microring resonator, and output the drop laser gain signal to the second microring resonator; and split the modulated laser into an add modulated laser and a drop modulated laser, output the add modulated laser to the first microring resonator, and output the drop modulated laser to the second microring resonator.

8. The device according to claim 1, wherein the splitter is further configured to:

acquire, through the input port of the splitter, the modulated laser;

split the laser gain signal into an add laser gain signal and a drop laser gain signal, output the add laser gain signal to the first microring resonator, and output the drop laser gain signal to the second microring resonator; or split the modulated laser into an add modulated laser and a drop modulated laser, output the add modulated laser to the first microring resonator, and output the drop modulated laser to the second microring resonator.

9. The device according to claim 1, wherein a parameter of the first microring resonator is the same as a parameter of the second microring resonator, and the parameter comprises: a radius of a microring waveguide, a spacing between a straight waveguide and a microring waveguide, a relative spacing between two straight waveguides, and a position relationship between two straight waveguides.

10. The device according to claim 1, wherein a center wavelength of the modulated laser is within a rising-edge range of the filtering response curve of the first microring resonator, and the center wavelength of the modulated laser is within a rising-edge range of the filtering response curve of the second microring resonator.

11. The device according to claim 1, wherein a relative distance between a resonant peak of the filtering response curve of the first microring resonator and a resonant peak of the filtering response curve of the second microring resonator is within a preset threshold range.

12. The device according to claim 1, wherein a variation of a temperature difference between the first microring resonator and the second microring resonator is less than a preset threshold, so that a relative distance between a resonant peak of the filtering response curve of the first microring resonator and a resonant peak of the filtering response curve of the second microring resonator is constant.

13. A laser modulation method, comprising:

generating a laser gain signal;

performing mode selection on the laser gain signal according to a first filtering response curve;

performing resonance on the laser gain signal obtained after the mode selection, so as to generate a laser after a laser generation condition is met;

loading a modulation signal to the laser, to modulate the laser and generate a modulated laser; and filtering the modulated laser according to a second filtering response curve, to generate an output laser, wherein the output laser matches the second filtering response curve.

14. The laser modulation method according to claim 13, further comprising:

detecting a first laser of the modulated laser that is not the output laser.

15. A system, comprising:

a plurality of devices, wherein output ports of the plurality of devices are connected to an input port of a common waveguide;

wherein each of the plurality of devices comprises: a gain medium, a resonant cavity, and a second microring resonator, wherein:

the resonant cavity comprises a first cavity mirror and a second cavity mirror, the first cavity mirror is located at one port of the gain medium, and the second cavity mirror is located at another port of the gain medium;

the second cavity mirror comprises one splitter, one first microring resonator, and one reflecting grating;

an input port of the splitter is connected to the another port of the gain medium;

a first output port of the splitter is connected to an input port of the first microring resonator, a second output port of the splitter is connected to the second microring resonator, and a download port of the first microring resonator is connected to the reflecting grating;

the gain medium is configured to generate a laser gain signal;

the resonant cavity that is formed by the first cavity mirror and the second cavity mirror performs resonance on the laser gain signal, and a laser is generated after a laser generation condition is met, wherein the first microring resonator is configured to perform mode selection on the laser gain signal according to a filtering response curve of the first microring resonator, and the reflecting grating is configured to reflect the laser gain signal obtained after the mode selection;

the gain medium is further configured to load a modulation signal to the laser that is generated in the resonant cavity, to modulate the laser that is generated in the resonant cavity and generate a modulated laser;

the splitter is configured to output the generated modulated laser to the second microring resonator through the second output port after the modulated laser is generated in the resonant cavity; and an input port of the second microring resonator is connected to the second output port of the splitter, the second microring resonator is configured to filter the modulated laser according to a filtering response curve of the second microring resonator to generate an output laser, and output the output laser through a download port of the second microring resonator, wherein the output laser matches the filtering response curve of the second microring resonator.

16. The system of claim 15, wherein each of the plurality of devices comprises:

a detector that is connected to the second microring resonator, an input port of the detector being connected to a straight-through port of the second microring resonator, and the detector being configured to detect a signal that is output by the straight-through port of the second microring resonator.

* * * * *